United States Patent
Lee et al.

(10) Patent No.: US 11,646,297 B2
(45) Date of Patent: May 9, 2023

(54) GLASS MEMBER AND ELECTRONIC DEVICE INCLUDING THE SAME

(71) Applicant: Samsung Electronics Co., Ltd., Gyeonggi-do (KR)

(72) Inventors: Jeongwon Lee, Gyeonggi-do (KR); Kyungmin Kwak, Gyeonggi-do (KR); Heongap Kim, Gyeonggi-do (KR)

(73) Assignee: Samsung Electronics Co., Ltd

( * ) Notice: Subject to any disclaimer, the term of this patent is extended or adjusted under 35 U.S.C. 154(b) by 359 days.

(21) Appl. No.: 16/991,117

(22) Filed: Aug. 12, 2020

(65) Prior Publication Data

US 2021/0074690 A1 Mar. 11, 2021

(30) Foreign Application Priority Data

Sep. 9, 2019 (KR) .................. 10-2019-0111248

(51) Int. Cl.
 *B32B 3/10* (2006.01)
 *H01L 25/075* (2006.01)
 (Continued)

(52) U.S. Cl.
 CPC ............ *H01L 25/0753* (2013.01); *B32B 3/04* (2013.01); *B32B 5/142* (2013.01); *B32B 17/10* (2013.01); *C03B 23/0302* (2013.01); *C03C 17/002* (2013.01); *C03C 17/3405* (2013.01); *G06F 3/041* (2013.01); *B32B 2255/26* (2013.01); *B32B 2307/4023* (2013.01); *B32B 2307/418* (2013.01); *B32B 2457/00* (2013.01); *C03C 2217/72* (2013.01); *Y10T 428/24777* (2015.01)

(58) Field of Classification Search
None
See application file for complete search history.

(56) References Cited

U.S. PATENT DOCUMENTS

2009/0009941 A1* 1/2009 Hsu ................. H05K 5/0243
 361/679.01
2013/0337224 A1 12/2013 Odani et al.
(Continued)

FOREIGN PATENT DOCUMENTS

KR 200348857 4/2004
KR 200382705 4/2005
(Continued)

OTHER PUBLICATIONS

International Search Report dated Nov. 18, 2020 issued in counterpart application No. PCT/KR2020/010586, 7 pages.

*Primary Examiner* — Christopher M Polley
(74) *Attorney, Agent, or Firm* — The Farrell Law Firm, P.C.

(57) ABSTRACT

Disclosed is an electronic device including a glass member having a flat portion and a side portion extending from an edge of the flat portion in at least a partially slanted or curved manner. The side portion includes a first curved portion extending from the flat portion, a second curved portion extending from the first curved portion and connected to the flat portion through the first curved portion, and at least one processing portion formed by at least a part of a border region between the first curved portion and the second curved portion. The at least one processing portion has a different refractive index from at least another portion of the side portion.

20 Claims, 14 Drawing Sheets

(51) Int. Cl.
  *C03B 23/03* (2006.01)
  *G06F 3/041* (2006.01)
  *C03C 17/00* (2006.01)
  *B32B 17/10* (2006.01)
  *C03C 17/34* (2006.01)
  *B32B 3/04* (2006.01)
  *B32B 5/14* (2006.01)

(56) References Cited

U.S. PATENT DOCUMENTS

| | | |
|---|---|---|
| 2017/0158547 A1* | 6/2017 | Dannoux ............ C03B 23/0258 |
| 2017/0289324 A1 | 10/2017 | Yeo et al. |
| 2017/0297945 A1 | 10/2017 | Lee |
| 2018/0281251 A1 | 10/2018 | Seo et al. |
| 2019/0171254 A1 | 6/2019 | Kim et al. |

FOREIGN PATENT DOCUMENTS

| | | |
|---|---|---|
| KR | 1020170033209 | 3/2017 |
| KR | 1020190065072 | 6/2019 |

* cited by examiner

GLASS MEMBER AND ELECTRONIC DEVICE INCLUDING THE SAME

CROSS-REFERENCE TO RELATED APPLICATION(S)

This application is based on and claims priority under 35 U.S.C. § 119 to Korean Patent Application No. 10-2019-0111248, filed on Sep. 9, 2019, in the Korean Intellectual Property Office, the disclosure of which is incorporated herein by reference in its entirety.

BACKGROUND

1. Field

The disclosure relates generally to an electronic device, and more specifically, to the electronic device including a glass member with at least a curved portion.

2. Description of Related Art

Modern-day electronic information communication technology integrates various functionalities into a single electronic device. For example, in addition to communication functionality, smartphones further include the functionalities of a sound player, imaging device, scheduler, and other functions through installed applications. An electronic device may execute its equipped applications or stored files and wiredly or wirelessly access a server or another electronic device to receive various information in real-time.

User demand for the appearance of electronic devices evolves as the use of smartphones increases. Metals or synthetic materials easily fit into designed shapes and are thus convenient in implementing the appearance of electronic devices. However, such limited materials may not suffice to meet various user needs. Thus, glass, ceramics, and other materials have been adopted as exterior materials for electronic devices.

However, glass or ceramics may be difficult to handle or shape as compared with metals or synthetic materials. For example, upon manufacturing the same shape of parts, these materials may require more time and cost than metals or synthetic materials.

As such, there is a need in the art for an improved exterior of electronic devices that is more cost-effective and time-effective in manufacture, and that enhances use convenience.

SUMMARY

Aspects of the disclosure address at least the above-mentioned problems and/or disadvantages and provide at least the advantages described below. Accordingly, an aspect of the disclosure is to provide a glass member and an electronic device including the glass member, which may meet users' diversified needs.

Another aspect of the disclosure is to provide a glass member that is easy to manufacture and capable of cost savings, and an electronic device including the glass member.

Another aspect of the disclosure is to provide a glass member, easy to manufacture and forming substantially four side surfaces, as well as the front surface (or back surface) of an electronic device, and molds for manufacturing the glass member.

In accordance with an aspect of the disclosure, a glass member comprises a flat portion, and a side portion extending at least partially slanted or curved from an edge of the flat portion and including a first curved portion extending from the flat portion, a second curved portion extending from the first curved portion and connected to the flat portion through the first curved portion, and at least one processing portion formed by at least a part of a border region between the first curved portion and the second curved portion, wherein the at least one processing portion has a different refractive index from a refractive index of at least another portion of the side portion.

In accordance with another aspect of the disclosure, an electronic device comprises a glass member including a flat portion forming a front surface or a back surface of the electronic device and a side portion forming a side surface of the electronic device, wherein the side portion is shaped as a closed loop surrounding the flat portion when viewed in a direction perpendicular to one surface of the flat portion, wherein the side portion includes a first curved portion extending from the flat portion, a second curved portion extending from the first curved portion and connected to the flat portion through the first curved portion, and at least one processing portion formed by at least a part of a border region between the first curved portion and the second curved portion, and wherein the at least one processing portion has a different refractive index from a refractive index of at least another portion of the side portion.

In accordance with another aspect of the disclosure, a glass member comprises a flat portion, and a side portion extending from an edge of the flat portion, at least partially slanted or curved, where in the side portion is shaped as a closed loop surrounding the flat portion when viewed in a direction perpendicular to one surface of the flat portion, the side portion including a first curved portion extending from the flat portion, a second curved portion extending from the first curved portion and connected to the flat portion through the first curved portion, and at least one processing portion formed by at least a part of a border region between the first curved portion and the second curved portion, wherein at least a portion of an inner surface of the second curved portion is formed to face the flat portion or an inner surface of the first curved portion in the direction perpendicular to the one surface of the flat portion, and wherein the at least one processing portion has a different refractive index from at least another portion of the side portion.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DETAILED DESCRIPTION

Figure 1:
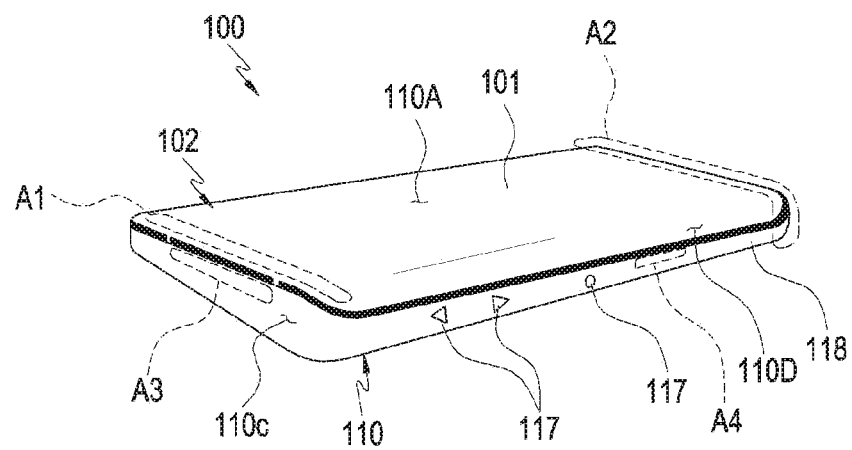
FIG. 1 is a front perspective view illustrating an electronic device according to an embodiment.

Embodiments will be described in detail with reference to the accompanying drawings. However, it should be understood that the disclosure is not limited to specific embodiments, and includes all modifications, equivalents, and alternatives within the spirit and the scope of the disclosure. Descriptions of well-known functions and/or configurations will be omitted for the sake of clarity and conciseness.

In the description of the drawings, similar reference numerals may be used to refer to similar or related elements. It is to be understood that a singular form of a noun corresponding to an item may include one or more of the items, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. Although ordinal terms such as "first" and "second" may be used to describe various elements, these elements are not limited by the terms. The terms are used merely to distinguish an element from the other elements. For example, a first element could be indicated as a second element, and similarly, a second element could be indicated as a first element without departing from the scope of the disclosure.

As used herein, the expression "and/or" includes any and all combinations of one or more associated items. It is to be understood that if an element (e.g., a first element) is referred to, with or without the term operatively or communicatively, as "coupled with" or "connected with" a second element, the first element may be coupled with the second element directly (e.g., wiredly), wirelessly, or via a third element.

Expressions such as "a front surface", "a rear surface", "a top surface", and "a bottom surface" which are described with respect to the orientation in the drawings may be replaced by ordinal numbers such as first and second. The order of such ordinal numbers is determined as stated or arbitrarily.

In the disclosure, the terms are used to describe specific embodiments and are not intended to limit the disclosure. As used herein, the singular forms are intended to include the plural forms as well, unless the context clearly indicates otherwise. In the disclosure, terms such as "include" and/or "have" may be understood to denote a certain characteristic, number, step, operation, constituent element, component or a combination thereof, but may not be construed to exclude the existence of or a possibility of addition of other characteristics, numbers, steps, operations, elements, components or combinations thereof.

Unless defined differently, all terms used herein, which include technical terminologies or scientific terminologies, have the same meaning as that understood by a person skilled in the art to which the disclosure pertains. Such terms as those defined in a generally used dictionary are to be interpreted to have the same meanings as the contextual meanings in the relevant field of art, and are not to be interpreted to have ideal or excessively formal meanings unless clearly defined in the disclosure.

In the disclosure, an electronic device may be a random device comprising a touch panel, and may be referred to as a terminal, a portable terminal, a mobile terminal, a communication terminal, a portable communication terminal, a portable mobile terminal, a touch screen, or the like.

For example, the electronic device may be a smartphone, a portable phone, a game player, a television (TV), a display unit, a heads-up display unit for a vehicle, a notebook computer, a laptop computer, a tablet personal computer (PC), a personal media player (PMP), a personal digital assistant (PDA), and the like. The electronic device may be implemented as a portable communication terminal which has a wireless communication function and a pocket size, and may be a flexible device or a flexible display device. However, the disclosure is not limited thereto.

The electronic device may communicate with an external electronic device, such as a server, or perform an operation through an interworking with the external electronic device. For example, the electronic device may transmit an image photographed by a camera and/or position information detected by a sensor unit to the server through a network, such as a mobile or cellular communication network, a local area network (LAN), a wireless LAN (WLAN), a wide area network (WAN), the Internet, or a small area network (SAN), but is not limited thereto.

Figure 2:
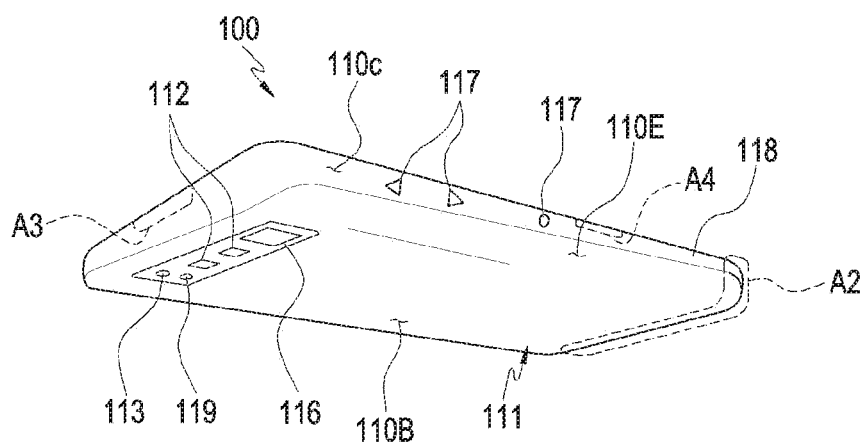
FIG. 2 is a rear perspective view illustrating the electronic device of FIG. 1.

FIG. 1 is a front perspective view illustrating an electronic device 100 according to an embodiment. FIG. 2 is a rear perspective view illustrating the electronic device 100 of FIG. 1.

Referring to FIGS. 1 and 2, an electronic device 100 may include a housing 110 with a first (or front) surface 110A, a second (or back) surface 110B, and side surfaces 110C surrounding the space between the first surface 110A and the second surface 110B. According to another embodiment, the housing may denote a structure forming the first surface 110A of FIG. 1, the second surface 110B of FIG. 2, and some of the side surfaces 110C of FIG. 1. At least part of the first surface 110A may have a substantially transparent front plate 102 (e.g., a glass plate or polymer plate including various coating layers).

The front plate 102 may be coupled with the housing 110 and may form an internal space along with the housing 110. The internal space indicates a space between the front plate 102 and a first supporting member 211 described below or a space between the first surface 110A and the second surface 110B. The internal space may receive at least part of the display 230 of FIG. 3 or the display 101.

Figure 6:
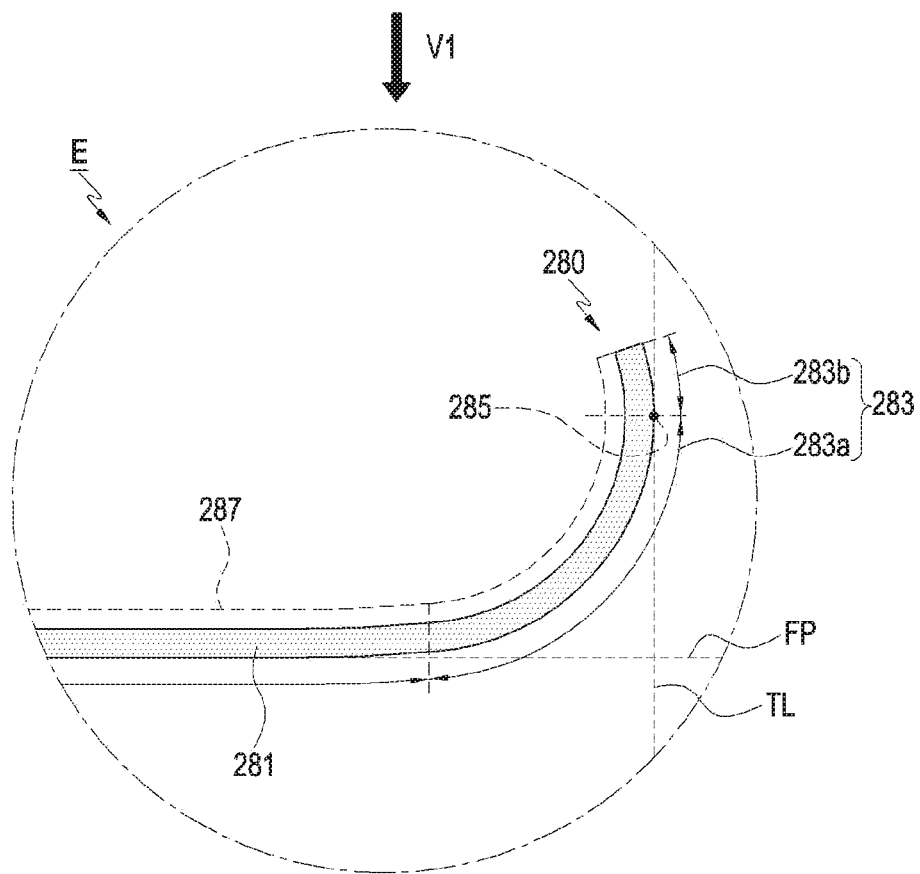
FIG. 6 illustrates a structure of a glass member according to an embodiment.

The second surface 110B may be formed of a substantially opaque back plate 111 that is laminated or colored glass, including at least one of the ornamental layer 387 of FIG. 6, ceramic, polymer, and metal (e.g., aluminum, stainless steel (STS), or magnesium). The back plate 111 may be formed of glass, and the side surface 110C may integrally extend from the back plate 111 and form substantially the four side surfaces of the electronic device 100. Alternatively, the side surface 110C may extend from the front plate 102, and the back plate 111 may be formed substantially as a flat plate. Although the back plate 111 may be substantially flat, the disclosure is not limited thereto. For example, the back plate 111 may include a curved second region 110E.

Figure 3:
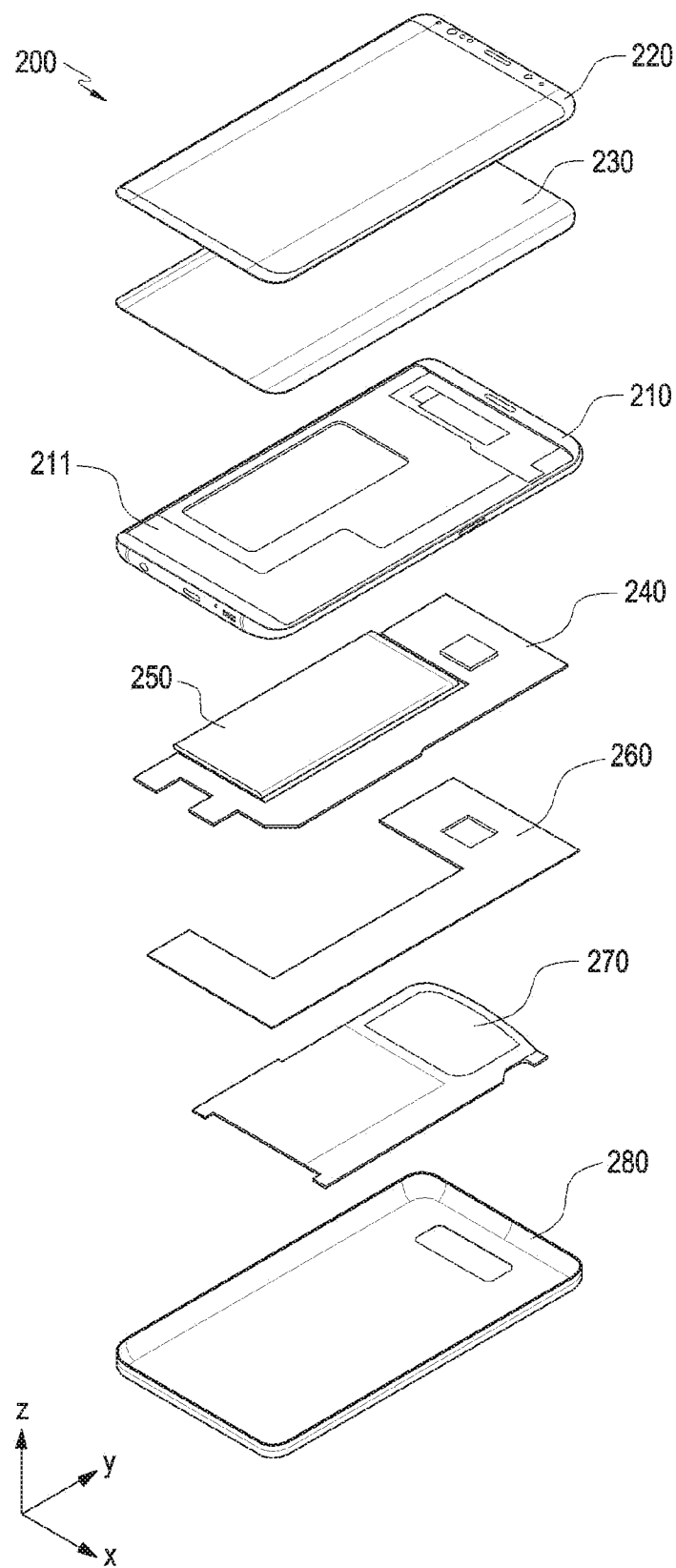
FIG. 3 is an exploded perspective view illustrating the electronic device of FIGS. 1 and 2.
Figure 4:
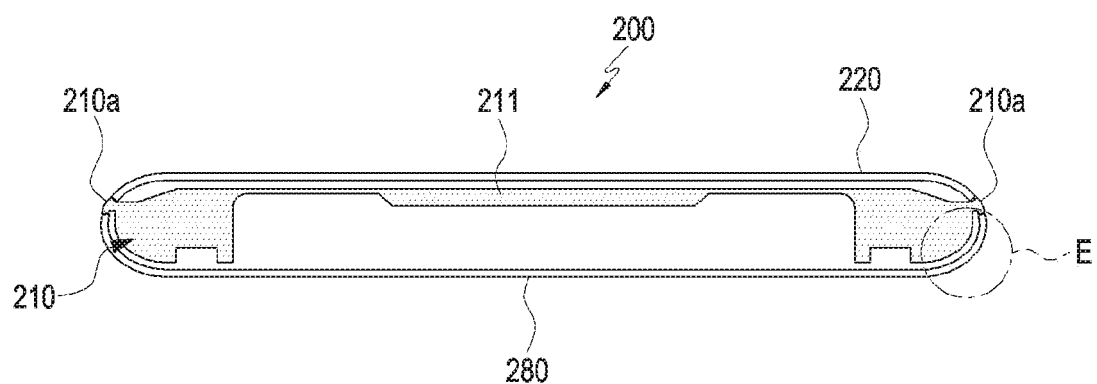
FIG. 4 is a cross-sectional view illustrating the electronic device of FIGS. 1 and 2.

A portion of the side bezel structure 210 (e.g., an exposed portion 210a of the side bezel structure 210 shown in FIGS. 3 and 4) may be exposed at the border between the front plate 102 and the back plate 111. For example, as viewed from above the side surface of the electronic device 100, the side bezel structure 210 may have a straight-line shape. Alternatively, the first plate 102 and the back plate 111 may be coupled together via the side bezel structure 210, covering the overall side bezel structure 210. The side bezel structure 210 may include a metal and/or polymer.

In FIGS. 1 and 2, the front plate 102 may include two first regions 110D (e.g., curved regions), which seamlessly bend and extend from the first surface 110A to the back plate 111, on both the long (side) edges of the front plate 102. The back plate 111 may include second curved regions 110E which seamlessly bend and extend from the second surface 110B to the front plate 102, on both the long side edges. The front plate 102 (or the back plate 111) may include only one of the first regions 110D (or the second regions 110E). Alternatively, at least part of the first regions 110D or the second regions 110E may be excluded.

The electronic device 100 may include at least one of a display 101, an audio module, sensor modules 116 and 119, a camera module 112, a key input device 117, a light emitting element (not shown), and a connector hole (not shown). The electronic device 100 may exclude at least one of the components or may add other components.

The display 101 may be exposed via a majority of the first plate 102. At least a portion of the display 101 may be exposed through the first plate 102 forming the first region 110D and the first surface 110A. The edge of the display 101 may be formed to be substantially the same in shape as an adjacent outer edge of the front plate 102. The interval between the outer edge of the display 101 and the outer edge of the front plate 102 may remain substantially even to enable the display 101 to have a larger area of exposure.

The screen display region (e.g., the active region), or a region (e.g., the inactive region) off the screen display region, of the display 101 may have a recess or opening in a portion thereof, and at least one or more of the audio module, sensor module, camera module, and light emitting element may be aligned with the recess or opening. The display 101 may include no recess or opening in the active region, some electronic components (e.g., a fingerprint sensor or camera module) may be disposed to overlap the active region of the display 101. At least one of the audio module, sensor module, camera module, and light emitting element may be disposed in the upper area A1 of FIG. 1. The display 101 may be disposed to be coupled with or adjacent to a touch detecting circuit, a pressure sensor capable of measuring the strength (pressure) of touches, and/or a digitizer for detecting a magnetic field-type stylus pen. At least part of the key input device 117 may be disposed in the first regions 110D and/or the second regions 110E.

The audio module may include a microphone hole and a speaker hole and be disposed in the lower area A2 of FIG. 1 or 2. At least one microphone may be disposed inside in a position corresponding to the microphone hole to obtain sounds from the outside and may detect the direction of a sound. There may be provided a plurality of microphone holes or a plurality of speaker holes, some of which may be disposed in other positions than the lower area A2 of FIG. 1 or 2. The speaker holes may include an external speaker hole and a phone receiver hole. The speaker hole and the microphone hole may be implemented as a single hole, or a speaker may be included without the speaker hole (e.g., a piezo speaker).

The sensor modules 116 and 119 may generate an electrical signal or data value corresponding to an internal operating state or external environmental state of the electronic device 100. The sensor modules 116 and 119 are arranged on the second surface 110B of the housing 110 in FIG. 2. However, the sensor modules 116 and 119 may be arranged on the first surface 110A of the housing 110 in FIG. 1. For example, a proximity sensor and/or fingerprint sensor may be disposed on the first surface 110A, and a heartrate monitor (HRM) sensor 119 and/or fingerprint sensor 116 may be disposed on the second surface 110B. For example, the fingerprint sensor may be disposed on the second surface 110A as well as on the first surface 110B (e.g., the display 101) of the housing 110. The electronic device 100 may further include sensor modules such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, and/or an illuminance sensor 104.

The camera devices 112 and 113 may include the camera module 112 and/or flash 113 disposed on the second surface 110B of the electronic device 100. The camera module 112 may include one or more lenses, an image sensor, and/or an image signal processor. The flash 113 may include, e.g., a light emitting diode (LED) or a xenon lamp. Two or more lenses (an IR camera, a wide-angle lens, and a telescopic lens) and image sensors may be disposed on one surface of the electronic device 100. An additional camera device may be disposed on the first surface 110B (e.g., the upper area A1) of the electronic device 100.

The key input device 117 may be disposed on the side surface 110C of the housing 110. The electronic device 100 may exclude all or some of the above-mentioned key input devices 117 and the excluded key input devices 117 may be implemented in other forms, such as soft keys on the display 101. The key input device may include the sensor module 116 disposed on the second surface 110B of the housing 110. Part of the key input device 117 may be replaced with a light emitting device (e.g., an indicator) to visually indicate, e.g., the charging status or reception of message. A sensor assembly may be disposed inside the key input device 117 to detect the user's body contact or variations in the pressure to the key input device 117.

A light emitting device may be disposed in the side areas A3 and A4 of the electronic device 100 and may provide visual information to the user using, e.g., preset flickering signals, or lighting colors. The user may recognize information regarding the operation state of the electronic device 100 or the reception of a call or message via the light emitting device.

The electronic device 100 may include connector holes for receiving connectors (e.g., a universal serial bus (USB) connector) for transmitting/receiving data and/or power to/from external electronic devices. For example, the electronic device 100 may connect to other electronic devices, a charger, or a sound device in a wired manner.

FIG. 3 is an exploded perspective view illustrating the electronic device of FIGS. 1 and 2. FIG. 4 is a cross-sectional view illustrating the electronic device 200 of FIGS. 1 and 2.

Referring to FIGS. 3 and 4, an electronic device 200 may include a side bezel structure 210, a first supporting member 211 (e.g., a bracket), a front plate 220, a display 230, a printed circuit board 240, a battery 250, a second supporting member 260 (e.g., a back case), an antenna 270, and a back plate 280. The electronic device 200 may exclude at least one of the components or may add other components. A portion of the side bezel structure 210, e.g., the exposed portion 210a is exposed to outside of the electronic device 200 at a circumference of the front plate 220 or a circumference of the back plate 280. As viewed from above the side surface of the electronic device 200, the side bezel structure 210 (e.g., the exposed portion 210a) may have a straight-line shape. At least one of the components of the electronic device 200 may be the same or similar to at least one of the components of the electronic device 100 of FIG. 1 or 2.

The first supporting member 211 may be disposed inside the electronic device 200 to be connected with the side bezel structure 210 or integrated with the side bezel structure 210. A side surface part of the back plate 280 may be provided to surround the side bezel structure 210. For example, part or all of the side bezel structure 210 may be hidden by the back plate 280. The first supporting member 211 may be formed of a metal and/or non-metallic material (e.g., polymer). The display 230 may be joined onto one surface of the first supporting member 211, and the printed circuit board 240 may be joined onto the opposite surface of the first supporting member 311. A processor, memory, and/or interface may be mounted on the printed circuit board 240. The processor may include one or more of a central processing unit, an application processor, a graphic processing device, an image signal processing, a sensor hub processor, and a communication processor.

Substantially the entire region of the display 230 may be attached on an inner surface of the front plate 220, and an opaque layer (e.g., the ornamental layer 387) may be formed around or along the periphery of the region where the display 230 is attached on the inner surface of the front plate 220. In the region of the front plate 220 where the display 230 is not disposed, the opaque layer may prevent part of the first supporting member 211 of the electronic device 200 from being exposed to the outside.

The memory may include, e.g., a volatile or non-volatile memory.

The interface may include, e.g., a high definition multimedia interface (HDMI), a USB interface, a secure digital (SD) card interface, and/or an audio interface. The interface may electrically or physically connect the electronic device 200 with an external electronic device and may include a USB connector, an SD card/multimedia card (MMC) connector, and/or an audio connector.

The battery 250 may supply power to at least one component of the electronic device 200. The battery 189 may include, e.g., a primary cell which is not rechargeable, a secondary cell which is rechargeable, and/or a fuel cell. At least a portion of the battery 250 may be disposed on substantially the same plane as the printed circuit board 240.

The battery 250 may be integrally or detachably disposed inside the electronic device 200. The antenna 270 may be disposed between the back plate 280 and the battery 250.

The antenna 270 may include, e.g., a near-field communication (NFC) antenna, a wireless charging antenna, and/or a magnetic secure transmission (MST) antenna. The antenna 270 may perform short-range communication with an external device or may wirelessly transmit or receive power necessary for charging. An antenna structure may be formed by a portion or combination of the side bezel structure 210 and/or the first supporting member 211.

Figure 5:
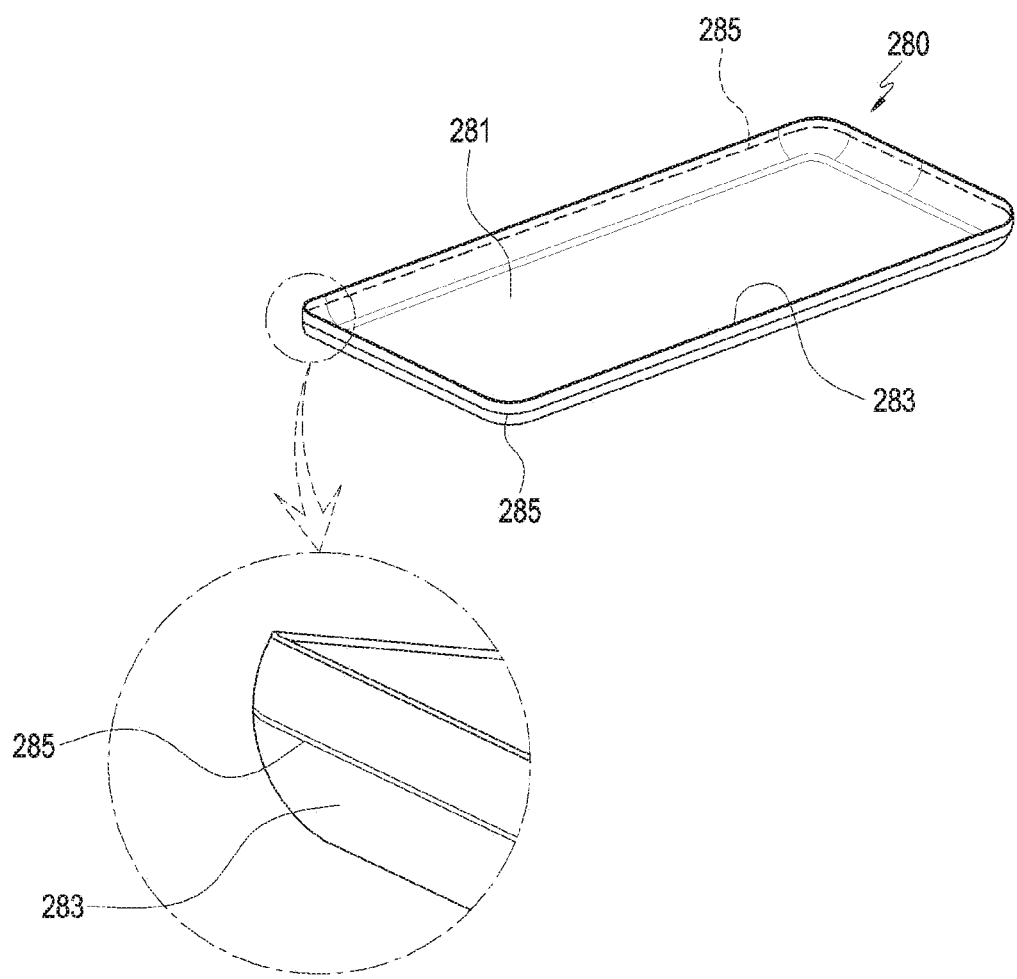
FIG. 5 is a perspective view illustrating a glass member according to an embodiment.

FIG. 5 is a perspective view illustrating a glass member 280 according to an embodiment. FIG. 6 illustrates a structure of a glass member 280, and is an enlarged view of portion 'E' of FIG. 4.

The glass member 280 is assigned the same reference number as the back plate 111 or 280 of FIG. 3 or 4, and the shown structure is an example in which the glass member 280 forms the back surface 110B and side surface(s) 110C of the electronic device 100 or 200. However, it should be noted that embodiments of the disclosure are not limited thereto. For example, as set forth above, the glass member 280 may form the first surface 110A and side surface 110C of the electronic device 100 or 200 in which the back plate may have a flat plate including a curved portion.

Referring to FIGS. 5 and 6, the glass member 280 may include a polygonal (e.g., rectangular) or circular flat portion 281 and a side portion 283 extending from the flat portion 281. The flat portion 281 may be formed substantially as a flat plate, and a portion of the region (e.g., edge) adjacent to the side portion 283 may be formed as a curved surface. As viewed in the direction perpendicular to one surface of the flat portion 281 (V1), the side portion 283 may be shaped substantially as a closed loop surrounding the flat portion 281. For example, when the flat portion 281 is rectangular, the side portion 283 may form four side surfaces. When the glass member 280 is included in the electronic device 100 or 200, the side portion 283 may form the four side surfaces of the electronic device 100 or 200.

The glass member 280 may include at least one processing portion 285 formed on the outer surface of the side portion 283. The processing portion 285 may be formed by removing some portion protruding from the outer surface when shaping into the glass member 280 and may have a different transmittance or refractive index from the other portion of the glass member 280. The partial protrusion of the outer surface of the glass member when the glass member is shaped is described below in detail with reference to FIGS. 12 to 20.

The processing portion 285 may be formed corresponding to the closed loop shape of the side portion 283. For example, a plurality of processing portions 285 may be arranged along the loop trace corresponding to the shape of the side portion 283. Alternatively, one processing portion 285 may be formed in a closed loop shape. In the structure where the plurality of processing portions 285 are formed, each processing portion 285 may be shaped as a line, dot, circle, or ellipse, and the processing portions may be arranged along a loop trace corresponding to the closed loop shape of the side portion 283. However, the disclosure is not limited thereto, and the shape or arrangement of the processing portion(s) 285 may vary.

The processing portion 285 may be a flat or curved surface that matches substantially the outer surface of the side portion 283. For example, without a difference in transmittance or refractive index, the processing portion 285 may not be identified with the naked eye from outside of the glass member 280. Even with a difference in the transmittance or refractive index of the processing portion 285, the processing portion 285 may hardly be identified with the user's naked eye. Some of the processing portions 285 may protrude from the outer surface of the side portion 283. For example, when some of the processing portions 285 are positioned to overlap the key input device 117 of FIG. 1 or 2, the slightly protruding shape allows the user to tactilely recognize the position of the key input device.

Some of the processing portions 285 which protrude from the outer surface of the side portion 283 may have a different transmittance or refractive index than another portion of the glass member 280. For example, the key input device 117 of FIG. 1 or 2 protruding from the outer surface of the side portion 283 may have a different transmittance or refractive index from another region of the processing portions 285 and/or another portion of the glass member 280. The shape of the portion protruding from the outer surface of the side portion 283 may include a figure or letter indicating the function allocated as the key input device. The portion protruding from the outer surface of the side portion 283 may be formed to at least partially overlap the processing portion 285 or in a position off the processing portion 285.

The glass member 280 may further include an ornamental layer 287. When the glass member 280 is used as the back plate 111 or 280, the ornamental layer 287 may be formed substantially on the entire inner surface of the glass member 280. The ornamental layer 287 may not be formed in some region of the glass member 280 depending on the outer design of the electronic device 100 or 200. The ornamental layer 287 may include an ultraviolet (UV) curing layer, a deposition layer, and a printing layer, as described below with reference to FIG. 8.

The side portion 283 may have a convex shape to the outside of the glass member 280. For example, the inner surface of the side portion 283 may be concave. As viewed in the direction perpendicular to one surface of the flat portion 281 (V1), the inner surface of the side portion 283 may be hidden by the side portion 283, which may include a first curved portion 283a and a second curved portion 283b. The first curved portion 283a may extend from the flat portion 281. For example, the first curved portion 283a may have a positive-slope shape, the slope of which from the flat portion 281 increases as it exits the flat portion 281 along the extending direction.

The second curved portion 283b may extend from the first curved portion 283a and connected to the flat portion 281 through the first curved portion 283a. The second curved portion 283b may have a negative-slope shape of which from the flat portion 281 decreases as it exits the first curved portion 283a along the extending direction. For example, when the slope of the first curved portion 283a from the flat portion 281 has a positive (+) value, the slope of the second curved portion 283b from the flat portion 281 may have a negative (−) value. At least a portion of the inner surface of the second curved portion 283b in the direction perpendicular to one surface of the flat portion 281 may be positioned opposite the flat portion 281 or the inner surface of the first curved portion 283a.

The processing portion 285 may be formed at the border (or in a border region) between the first curved portion 283a and the second curved portion 283b. For example, at the point where the slope from the flat portion 281 changes from a positive to negative value or the absolute value of the slope is the maximum value, the processing portion 285 may be formed on the outer surface of the side portion 283. The processing portion 285 may be formed at the contact point of the tangent line TL perpendicular to the flat portion 281 (or the flat surface FP including the flat portion 281) among the tangent lines to the outer surface of the side portion 283. As described below, as the processing portion 285 is formed in the position, the shaped glass member 280 may be easily removed from the molding device (e.g., the molding device 800 of FIG. 12). However, the disclosure is not limited thereto, and an additional processing portion(s) may be formed in a position(s) different from the above-described position. The additional processing portions may be formed corresponding to the key input device 117 or side areas A3 and A4 of FIG. 1 or 2.

Figure 7:
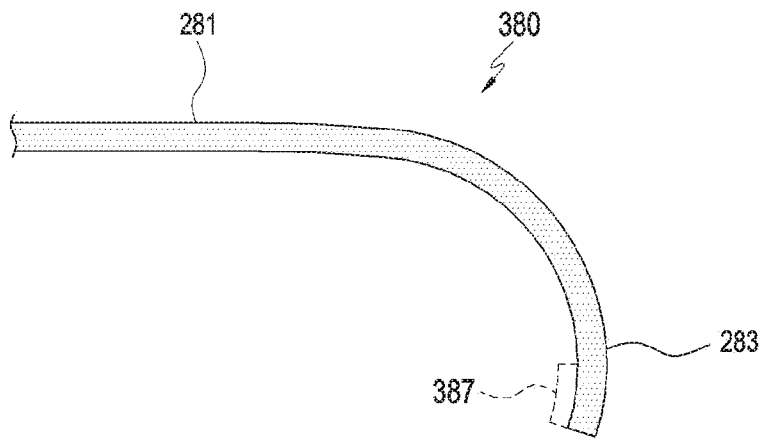
FIG. 7 illustrates a modified glass member according to an embodiment.

FIG. 7 illustrates a modified glass member 380 (e.g., the back plate of FIG. 3 or the glass member 280 of FIG. 6) according to an embodiment.

The glass member 380 of FIG. 7 may have a similar shape to the glass member 380 of FIG. 6 and be disposed to form the front surface and side surface(s) of the electronic device 100 or 200. As disposed to form the front surface (and/or side surface) of the electronic device, the glass member 380 may transmit the screen output from the display 101 or 230 while protecting the display. When the glass member 380 is disposed to form the front surface (and/or side surface) of the electronic device, the ornamental layer 387 of the glass member 380 may be formed along the edge of the inner surface of the glass member 380. For example, the ornamental layer 387 may be formed in a portion of the inner surface of the side portion 283 and be positioned around the screen transmittance region of the glass member 380.

The ornamental layers 287 and 387 of FIGS. 6 and 7 are described below with reference to FIG. 8.

Figure 8:
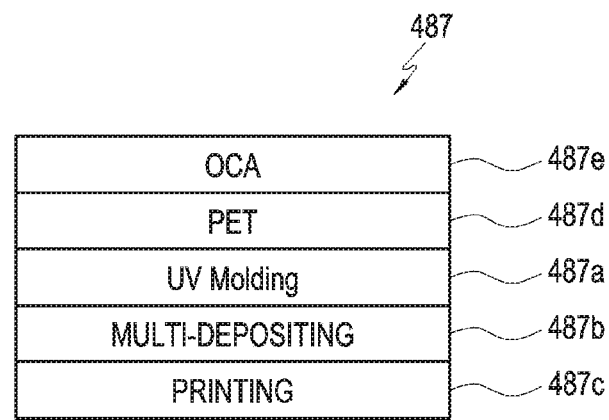
FIG. 8 illustrates a configuration of an ornamental layer of a glass member according to an embodiment.

FIG. 8 illustrates a configuration of an ornamental layer 487 of a glass member according to an embodiment.

In FIG. 8, the configuration or order of arrangement of the layers is merely an example and various configurations or orders of arrangement may be adopted depending on the material of each layer or the process of forming the material. Some of the layers may be omitted, or another layer such as a clear layer or primer layer may be added.

Referring to FIG. 8, the ornamental layer 487 may include at least one of a UV curing layer 487a, a deposition layer 487b, a printing layer 487c, a base film 487d (e.g., polyester or polyethylene terephthalate (PET)-based) and an optical adhesive (OCA) layer 487e. For example, when the UV curing layer 487a, the deposition layer 487b, or the printing layer 487c may be formed directly on the surface of the glass member 280 or 380, the base film 487d or the optical adhesive layer 487e may be omitted. With the shaping into the glass member 280 or 380 complete, the UV curing layer 487a, the deposition layer 487b, or the printing layer 487c may be formed directly on the surface of the glass member 280 or 380. For example, as the process of forming directly on the surface of the glass member 280 or 380, a process of shaping into the glass member 280 or 380 and a step of forming the UV curing layer 487a, the deposition layer 487b, or the printing layer 487c may be sequentially performed. When the ornamental layer 487 includes the base film 487d, the UV curing layer 487a, the deposition layer 487b, or the printing layer 487c may sequentially be formed on the base film 487d independently from shaping into the glass member. For example, use of the base film 487d may reduce the processing time for forming the glass member with the ornamental layer 487.

The UV curing layer 487a may be formed by applying a UV curing agent onto the surface of the base film 487d (or the surface of the glass member 280 or 380) and then hardening the UV curing agent. The UV curing agent may be repeatedly applied onto the surface of the base film 487d and, to reduce the hardening time of the UV curing agent, heating or light exposing may be performed. After being hardened, the UV curing layer 487a may have a predetermined degree of light transmittance. For example, the UV curing layer 487a may be transparent or semi-transparent. The deposition layer 487b may be formed by attaching metal particles to the UV curing layer 487a. For example, the deposition layer 487b may be formed by plating, vacuum deposition, or electronic beam deposition. By having the deposition layer 487b, the glass member 280 or 380 may at least partially have a metal appearance. The printing layer 487c may be formed by applying a paint to the surface of the deposition layer 487b. The printing layer 487c may prevent the deposition layer 487b from exposure to the external environment and add a color to the metal appearance given by the deposition layer 487b.

With the printing layer 487c sufficiently dried, the base film 487d may be attached to the overall inner surface of the glass member 280 or 380 or the edge of the inner surface of the glass member 280 or 380 through the optical adhesive layer 487e. The deposition layer 487b may reflect the light from the outside, allowing the glass member 280 or 380 or the electronic device 100 or 200 to appearance as a metal. The metal appearance created by the light reflection, along with the color of the printing layer 487c, may provide various visual effects.

Figure 9:
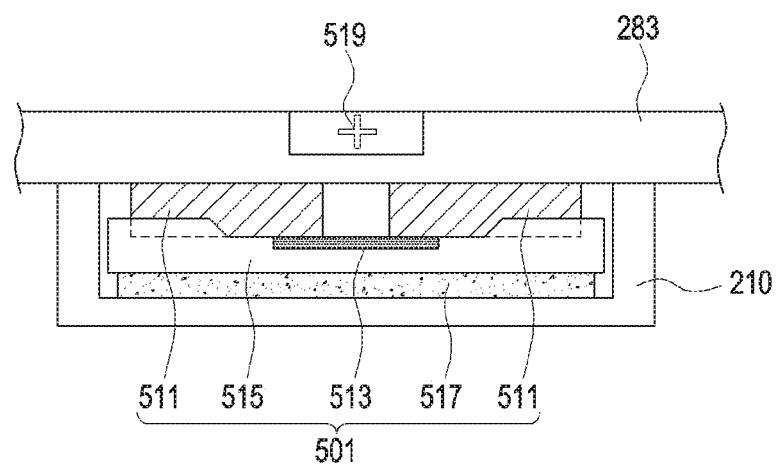
FIG. 9 illustrates a configuration of a portion of an electronic device according to an embodiment.

FIG. 9 illustrates a configuration of a portion of an electronic device 100 or 200 according to an embodiment.

Referring to FIG. 9, an electronic device 100 or 200 may include a sensor assembly 501 disposed corresponding to an operable portion 519 of a side portion 283. The sensor assembly 501 may be disposed to face the side portion 283 or the operable portion 519 inside the glass member 280. For example, the sensor assembly 501 may be disposed between the side portion 283 and the side bezel structure 210 and may include an elastic member 517 to allow the sensor assembly 501 to tightly contact the inner surface of the side portion 283 or the operable portion 519. The sensor assembly 501 may be a pressure sensor that detects pressure applied to the operable portion 519. For example, when the operable portion 519 is pressurized, the sensor assembly 501 may be configured to detect variations in the pressure.

The sensor assembly 501 may be a strain gauge sensor that includes transmission pieces 511, a resistive element 513, a supporting plate 515, and/or the elastic member 517. The transmission pieces 511 and the resistive element 513 may be mounted on the supporting plate 515, and the transmission pieces 511 may be disposed to tightly contact the inner surface of the side portion 283 (e.g., the operable portion 519). When deformed by external force, the resistive element 513 may undergo variations in resistance, and different portions thereof may be fastened by the transmission pieces 511. For example, when a relative displacement occurs between the transmission pieces 511, the resistive element 513 may be deformed so to have a varying resistance. The sensor assembly 501 or the electronic device may generate an input signal based on the variation in resistance.

The elastic member 517 may maintain the transmission pieces 511 in tight contact with the inner surface of the side portion 283. When pressurized, the operable portion 519 may be deformed so that a relative displacement may occur between the transmission pieces 511. For example, the sensor assembly 501 may generate an input signal based on the variation in the pressure applied to the operable portion 519. Despite the description that the operable portion is deformed, the deformation of the operable portion 519 may be such that the user may not visually or tactilely perceive but may deform the resistive element 513 or vary the resistance of the resistive element 513.

Although in the above example an input signal is generated based on a variation in mechanical pressure or resistance, the disclosure is not limited to such a configuration. For example, when the glass member 280 is formed on the front surface of the electronic device, a touch sensing circuit (e.g., a pressure sensor or ultrasonic sensor) provided on the display or front plate may be provided in a region corresponding to the side portion 283. For example, at least the operable portion 519 of the side portion 283 may be utilized as an input device for detecting the user's body contact, drag, or hovering. In the structure where the touch sensing circuit is provided in the region corresponding to the side portion 283, the active region of the display may overlap the touch sensing circuit in the region corresponding to the side portion 283. When the active region overlaps the touch sensing circuit and is thus positioned on the side portion 283, the display may output an icon(s) corresponding to volume keys, a power key, and function keys per the user's settings in the side portion 283.

Figure 10:
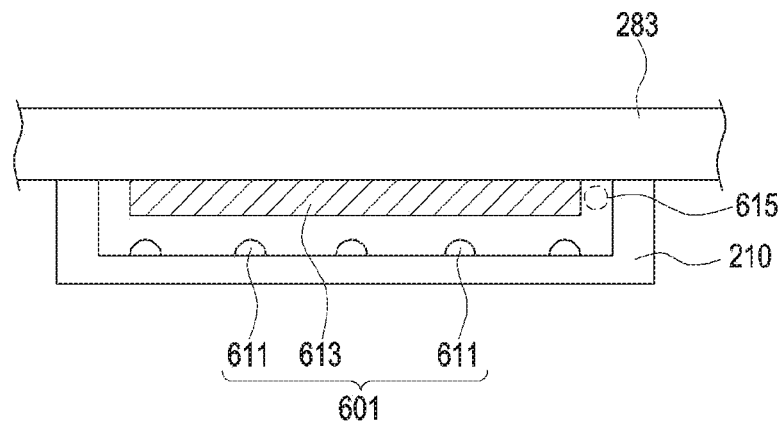
FIG. 10 illustrates a configuration of another portion of an electronic device according to an embodiment.

FIG. 10 illustrates a configuration of another portion of the electronic device 100 or 200 according to an embodiment.

Referring to FIG. 10, the electronic device may further include a light emitting device 601 that is positioned in at least one of the side areas A3 and A4 of FIG. 1. For example, the light emitting device 601 may be disposed on the inside of the side portion 283 in the position corresponding to the side areas A3 and A4. The light emitting device 601 may include light emitting diodes 611 and 615 and a diffuser plate 613.

The diffuser plate 613 may be attached onto the inner surface of the side portion 283, and the light emitting elements 611 and 615 may radiate light to the inside of the diffuser plate 613 and provide various pieces of visual information to the outside of the side portion 283 using flickering signals or light colors. According to a light emitting structure, light emitting elements 611 may be disposed to face the side portion 283, with the diffuser plate 613 disposed therebetween, or a light emitting element 615 may be mounted on the side portion in parallel with the diffuser plate. The light emitting device 601 may be disposed in a plurality of regions. The electronic device may display information regarding the position (or region) of the antenna currently performing wireless communication or information regarding the application currently being executed, using the light emitting device 601.

Figure 11:
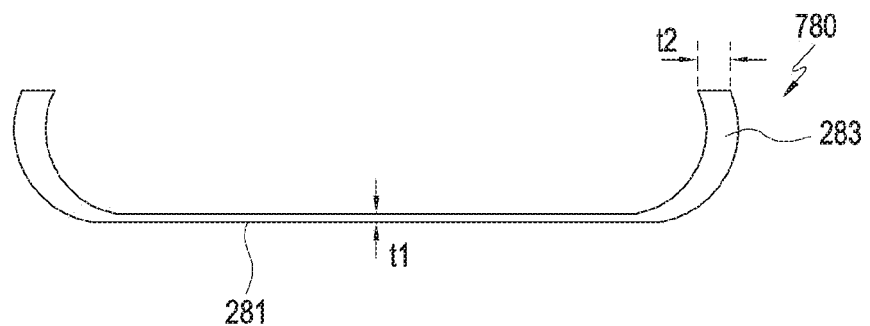
FIG. 11 is a cross-sectional view illustrating a modified glass member according to an embodiment.

FIG. 11 is a cross-sectional view illustrating a modified glass member 780 according to an embodiment.

Referring to FIG. 11, a glass member 780 may have different thicknesses depending on its portions. For example, a flat portion 281 may have a thickness t1 which is smaller than the thickness of a side portion 283. The glass member 780 is used on the outside of the electronic device and may thus be exposed to external impacts due to a fall. For example, the portion of the glass member 780, which may be more frequently exposed to external impacts or where external impacts may concentrate, may be thicker than the rest of the glass member 780, mitigating or preventing the risk of damage.

A molding device 800 and a method of manufacturing the above-described glass members 280, 380, and 780 using the molding device 800 are described below with reference to FIGS. 12 to 20 and FIG. 6. In the following description, although among the molds 801, 802, and 803 forming the molding device 800, a first mold 801 is disposed at the bottom, and a third mold 803 is disposed at the top, the disclosure is not limited thereto. For example, with the third mold 803 disposed at the bottom, and the first mold 801 at the top, the glass member 280 may be shaped, and the relative positions of the molds 801, 802, and 803 may be selected properly depending on the specifications of the equipment and the manufacturing environment.

Figure 12:
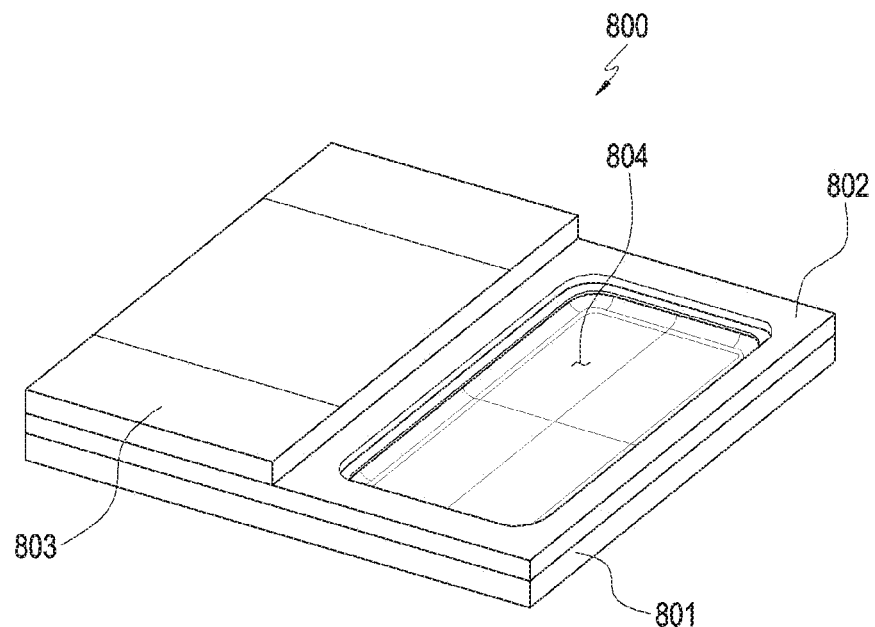
FIG. 12 is a perspective view illustrating a molding device for shaping into a glass member according to an embodiment.
Figure 13:
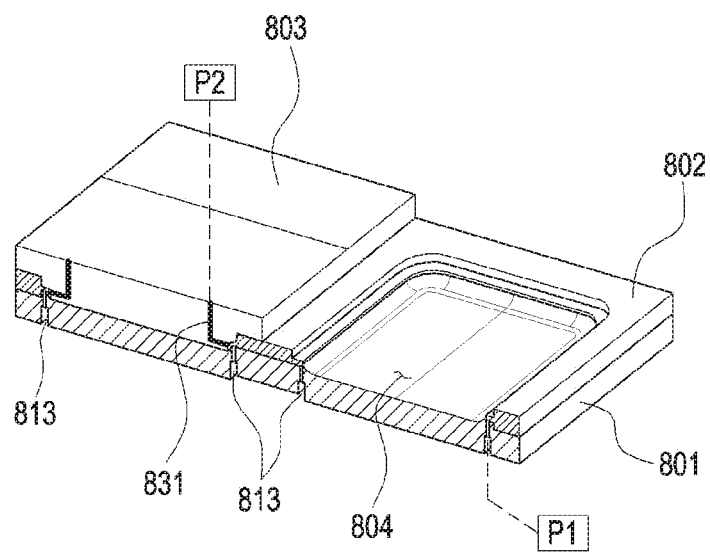
FIG. 13 is a perspective view illustrating a molding device for shaping into a glass member, with a cut off portion, according to an embodiment.
Figure 14:
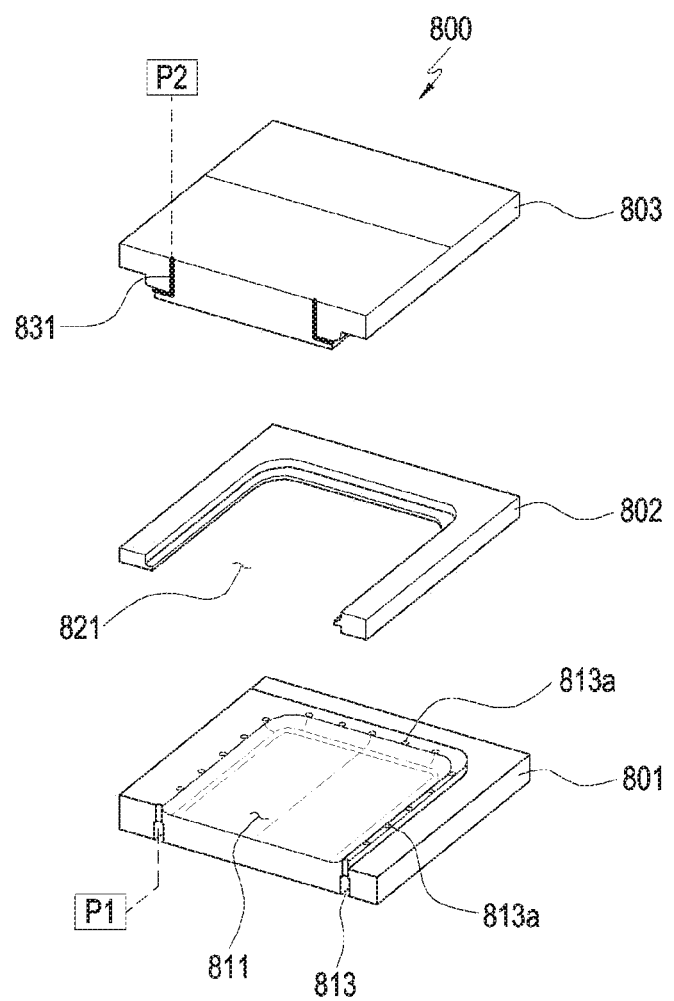
FIG. 14 is an exploded perspective view illustrating a molding device for shaping into a glass member according to an embodiment.
Figure 15:
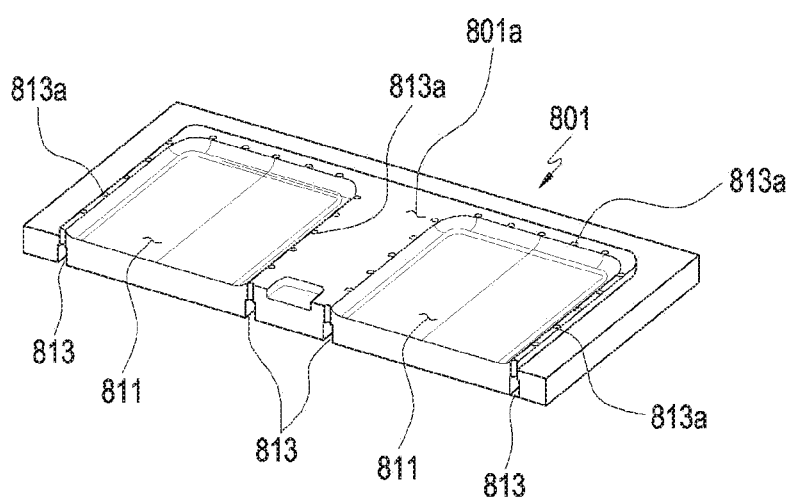
FIG. 15 is a perspective view illustrating a first mold of a molding device for shaping into a glass member according to an embodiment.

FIG. 12 is a perspective view illustrating a molding device 800 for shaping into a glass member 280 according to an embodiment. FIG. 13 is a perspective view illustrating a molding device 800 for shaping into a glass member, with a cut off portion, according to an embodiment. FIG. 14 is an exploded perspective view illustrating a molding device 800 for shaping into a glass member according to an embodiment. FIG. 15 is a perspective view illustrating a first mold 801 of a molding device 800 for shaping into a glass member according to an embodiment.

Referring to FIGS. 12, 13, 14 and 15, a molding device 800 may include a first mold 801, a second mold 802, and/or a third mold 803. The first mold 801 may include a first molding space 811 and a first pressure hole 813. The first molding space 811 may provide a shape (or space) for shaping into the first curved portion 283a of the side portion 283 and the flat portion 281 of the above-described glass member 280. For example, the bottom surface of the first molding space 811 may form the flat portion 281, and the inner side walls of the first molding space 811 may form the first curved portion 283a. The first pressure hole 813 may be formed through a portion of the first mold 801 and be connected with a first pump (e.g., a suction pump) P1. In a region separated from the first molding space 811, one end 813a of the first pressure hole 813 may be positioned on the top surface 801a of the first mold 801.

The second mold 802 may be coupled to the top surface 801a of the first mold 801 and may include a second molding space 821 corresponding to the first molding space 811. When the second mold 802 is coupled to the first mold 801, the first molding space 811 and the second molding space 821 may be combined to form a glass molding space 804. For example, the inner side walls of the second molding space 821 may form the second curved portion 283b of the side portion 283. With the second mold 802 coupled with the first mold 801, the inner side walls 883 (see FIG. 16) of the glass molding space 804 may be concave. When the glass molding space 804 is viewed from outside of the second mold 802 in the vertical direction (V2 of FIG. 17), the second mold 802 may hide at least the inner side wall 883 of the glass molding space 804.

When the second mold 802 is coupled with the first mold 801, the first pressure hole 813 may be connected to the glass molding space 804 through the third pressure hole 815 (see FIG. 16) between the first mold 801 and the second mold 802. For example, the first pressure hole 813 may be connected to the inner side wall 883 of the glass molding space 804, as described with reference to FIG. 16.

Figure 16:
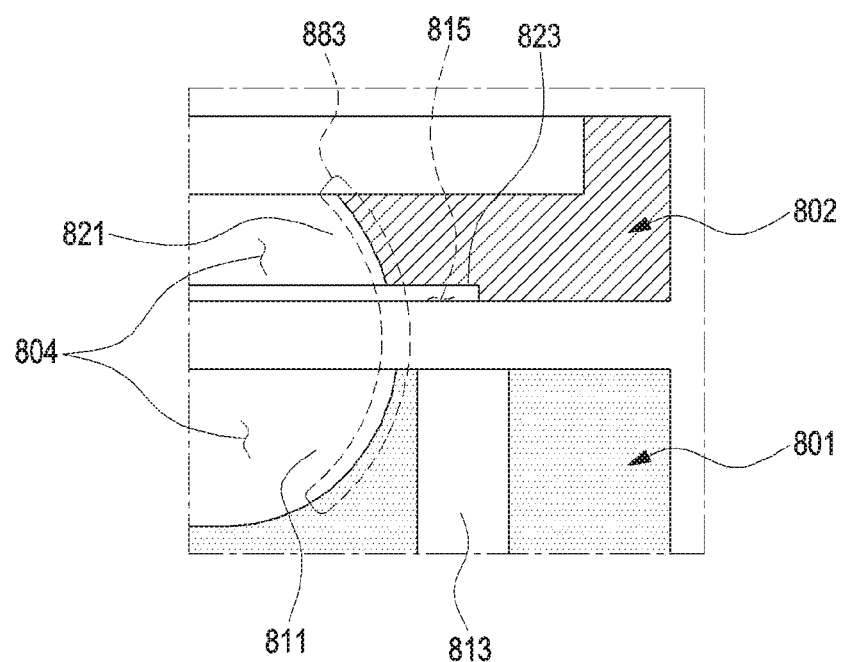
FIG. 16 is a cross-sectional view illustrating a portion of a molding device for shaping into a glass member according to an embodiment.

FIG. 16 is a cross-sectional view illustrating a portion of a molding device 800 for shaping into a glass member (e.g., the back plate of FIG. 3 or the glass member 280 of FIG. 6) according to an embodiment.

Referring to FIG. 16, the second mold 802 may include a stepped region 823 formed on the bottom surface at the periphery of the second molding space 821. The stepped region 823 of the second mold 802 may be shaped as a closed loop surrounding the second molding space 821 while touching the second molding space 821 on the bottom surface of the second mold 802. The stepped region 823 may be shaped as a recess extending from the second molding space 821. A plurality of stepped regions 823 may be arranged along the periphery of the second molding space 821.

With the bottom surface of the second mold 802 tightly coupled to the top surface 801a of the first mold 801, a predetermined gap, e.g., the third pressure hole 815, may be formed between the stepped region 823 of the second mold 802 and the top surface 801a of the first mold 801. The third pressure hole 815 may connect one end 813a of the first pressure hole 813 to the glass molding space 804. For example, one end of the third pressure hole 815 may be positioned on the inner side wall 883 of the glass molding space 804. When viewed from the inside of the glass molding space 804, the third pressure hole 815 may form a closed loop along the inner side wall 883 of the glass molding space 804. There may be provided a plurality of third pressure holes 815. When viewed from the inside of the glass molding space 804, the plurality of third pressure holes 815 may be arranged along the loop and the inner side wall of the glass molding space 804.

Although in the instant embodiment, the first pressure hole 813 or the third pressure hole 815 is formed in the first mold 801 or second mold 802, it should be noted that the disclosure is not limited thereto. For example, the stepped region 823 of the second mold 802 for forming the third pressure hole 815 may be formed in the first mold 801. For example, a stepped region may be formed on the top surface 801a of the first mold 801, and the stepped region formed in the first mold 801 may extend from the first molding space 811 to one end 813a of the first pressure hole 813. The first pressure hole 813 may connect to the glass molding space 804 without passing through the third pressure hole 815 or the stepped region. For example, one end of the first pressure hole 813 may be positioned on the inner side wall of the first molding space 811, and the stepped region may not be formed. Alternatively, the first pressure hole 813 may be formed not in the first mold 801 but in the second mold 802. The pressure hole formed in the second mold 802 may pass through the inner side wall of the second molding space 821 to connect to the glass molding space 804 or may connect to the glass molding space 804 through the first mold 801 or the second mold 802.

The third mold 803 may enter the inside of the glass molding space 804. For example, with a flat raw glass plate placed on the glass molding space 804, the third mold 803 may enter the glass molding space 804 while pressing the raw glass plate. While the third mold 803 enters the glass molding space 804, a portion of the raw glass plate may be bent to face the inner side wall 883 of the glass molding space 804. The third mold 803 may include the second pressure hole 831. With the third glass 803 placed in the glass molding space 804, one end of the second pressure hole 831 may be positioned to face the inner side wall 883 of the glass molding space 804, with a portion of the raw glass plate disposed therebetween. The second pressure hole 831 may be formed through a portion of the third mold 803 and may connect with a second booster pump P2.

When the first pump P1 operates, the bent portion of the raw glass plate may come in tight contact with the inner side wall 883 of the glass molding space 804. For example, the first pump P1 may reduce the pressure of the outside (e.g., between the raw glass plate and the inner side wall 883 of the glass molding space 804) of the raw glass plate, thereby shaping the side portion 283 into the shape corresponding to the inner side wall 883 of the glass molding space 804. When the first pump P1 operates, the second pressure hole 831 may allow influx of external gas to the inside of the raw glass plate, prompting the shaping of the side portion 283. For example, in the structure in which the molding device 800 includes the first pump P1, the second pump P2 may be omitted.

When the second pump P2 operates, the bent portion of the raw glass plate may come in tight contact with the inner side wall 883 of the glass molding space 804. For example, the second pump P2 may increase the pressure of the inside of the raw glass plate, bringing a portion of the raw glass plate in tight contact with the inner side wall 883 of the glass molding space 804 and hence shaping the side portion 283. When the second pump P2 operates, the first pressure hole 813 allows the gas outside of the raw glass plate (e.g., between the raw glass plate and the inner side wall 883 of the glass molding space 804) to be discharged to the outside, prompting the shaping of the side portion 283. For example, when the molding device 800 includes the second pump P2, the first pump P1 may be omitted.

FIGS. 17, 18, 19 and 20 illustrate operations for shaping into a glass member according to an embodiment.

Figure 17:
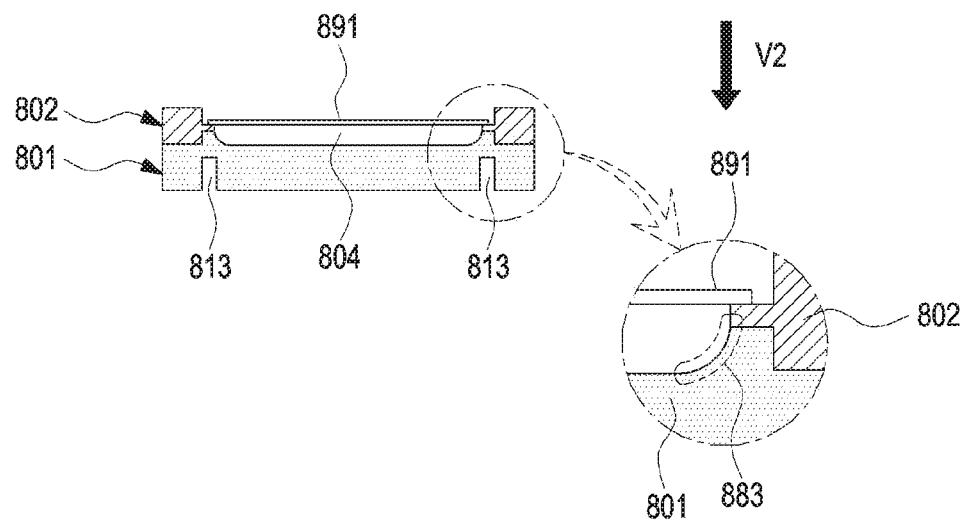
FIGS. 17, 18, 19, and 20 illustrate operations for shaping into a glass member according to an embodiment.

Referring to FIG. 17, a raw glass plate 891 may be placed on the second mold 802 or the glass molding space 804. For example, before or after the second mold 802 is coupled to the first mold 801, the raw glass plate 891 may be placed on the second mold 802. Since glass typically has rigidity at the room temperature, the raw glass plate 891 may remain flat while it sits on the second mold 802.

Figure 18:
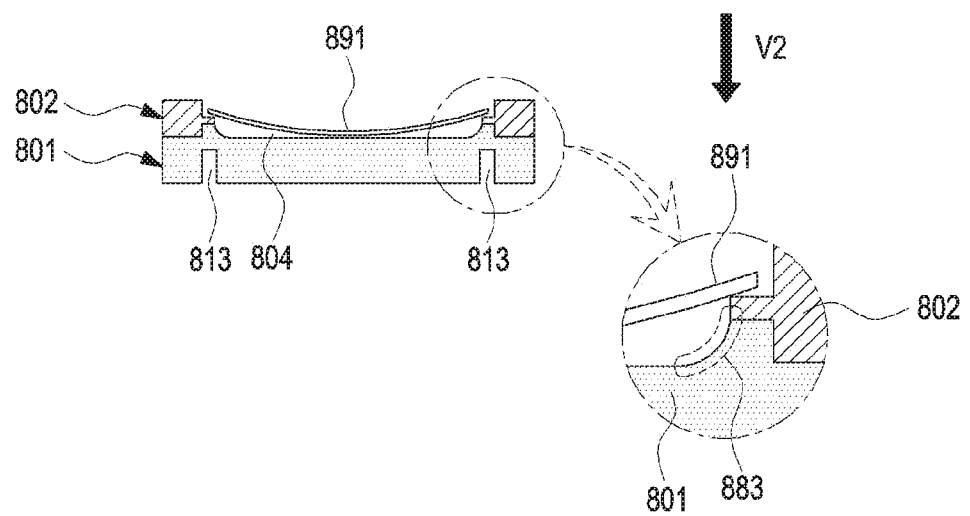

Referring to FIG. 18, before shaping into the glass member 280, the raw glass plate 891 (and/or the first mold 801 and the second mold 802) may be pre-heated and, upon reaching a proper temperature, the raw glass plate 891 may become pliable. For example, in the pre-heated state, the raw glass plate 891 may be curved by its own weight, so that a portion thereof may enter the inside of the glass molding space 804. The pre-heating temperature of the raw glass plate 891 may be about 800 degrees Celsius.

Figure 19:
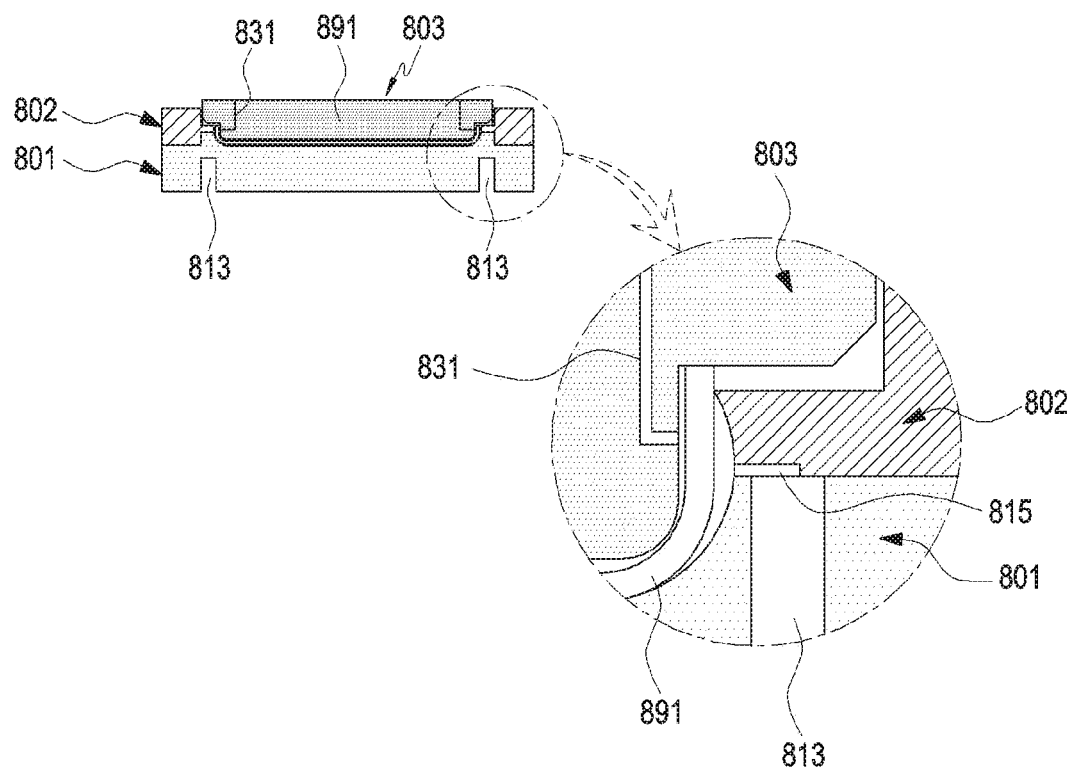

Referring to FIG. 19, in the pre-heated state of the raw glass plate 891, the third mold 803 may enter the glass molding space 804. While the third mold 803 enters, a portion of the raw glass plate 891 may be bent to face each of the bottom surface of the first molding space 811 of the glass molding space 804 and the inner side wall 883 of the glass molding space 804. For example, the glass member 280 may be roughly shaped. While the third mold 803 enters the glass molding space 804, the molds 801, 802, and 803 and/or the raw glass plate 891 may be heated. For example, a predetermined temperature of about 700 degrees Celsius may be maintained to allow the raw glass plate 891 to remain pliable while the shaping proceeds.

Figure 20:
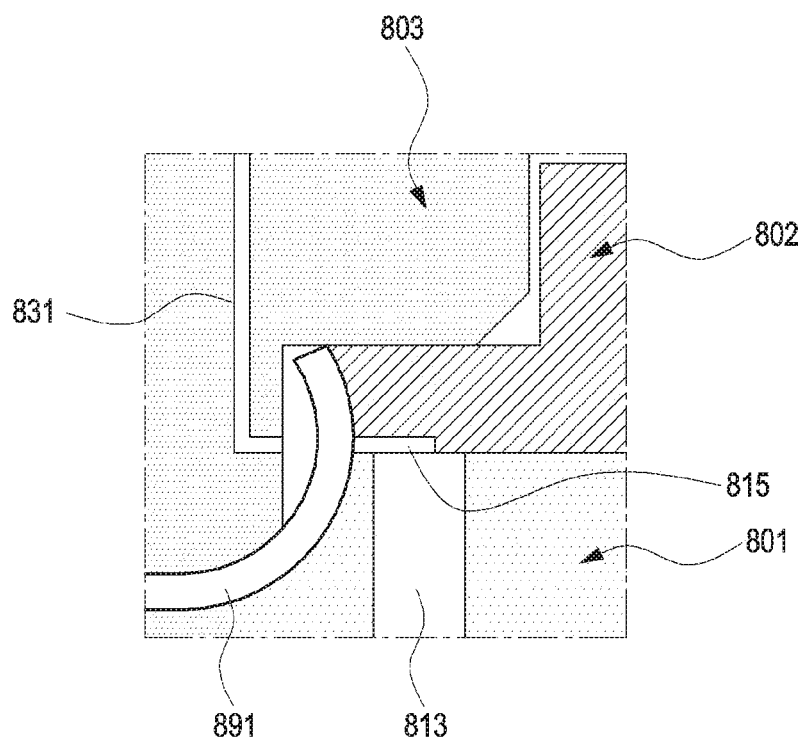

Referring to FIG. 20, in the bent state of the raw glass plate 891, either the first pump P1 or the second pump P2 operates, shaping the side portion 283 into a shape corresponding to the inner side wall 883 of the glass molding space 804. As described above, in the structure where the first pump P1 operates, the second pressure hole 831 may permit external air to flow into the inside of the raw glass plate 891. Alternatively, in the structure where the second pump P2 operates, the first pressure hole 813 may drain the gas present between the raw glass plate 891 and the inner side wall 883 of the glass molding space 804.

After the shaping of the side portion 283 is complete, the molds 801, 802, and 803, and/or the resultant glass member 280 may be gradually cooled down to the room temperature during which the raw glass plate 891 or the glass member 280 may be hardened. After the shaping and cooling are performed, the third mold 803 and the second mold 802 may be sequentially removed from the first mold 801 and, with the second mold 802 removed from the first mold 801, the glass member 280 may be removed. As set forth above, the side portion 283 of the glass member 280 may form substantially all of the four side surfaces of the electronic device 100 or 200 and form substantially a closed loop shape surrounding the flat portion 281.

When the first pump P1 or the second pump P2 operates so that a portion of the raw glass plate 891 tightly contacts the inner side wall 883 of the glass molding space 804, the portion of the raw glass plate 891 may be introduced into the third pressure hole 815. For example, portions of the outer surface of the complete glass member 280 (e.g., the outer surface of the side portion 283) may be protruded. The protrusions may have a closed loop shape or be arranged along a loop depending on the shape of the third pressure hole 815 or the stepped portion of the second mold 802.

The protrusions on the side portion 283 may be polished, thus leaving the processing portion 285. For example, the processing portion 285 may be substantially a surface or region formed by removing portions of the glass member 280 and may have a different refractive index than the rest of the glass member 280. Some of the protrusions may be not removed but remain on the outer surface of the side portion 283. For example, the protrusion of the side portion 283 may be part of the key input device 117 of FIG. 1 and allow the user to tactilely perceive the position of the key input device 117.

The protrusion of the side portion 283 may be formed substantially at the border (or border region) between the first curved portion and second curved portion of the side portion 283. Such position of the protrusion may offer an environment where the complete glass member 280 may easily be removed from the molding device 800. As set forth above, the protrusion of the side portion 283 may be formed in the position corresponding to the third pressure hole 815 or the stepped region 823 of the second mold 802. For example, as described above in connection with FIG. 6, the tangent line TL to the side portion 283 passing through the processing portion 285 is disposed perpendicular to the flat portion 281. Thus, the protrusion of the side portion 283 may be positioned substantially at the point where the complete glass member 280 has the maximum length or width.

After the shaping and cooling of the glass member 280 are performed, the second mold 802 is removed from the first mold 801. Then, the protrusion of the side portion 283, e.g., the maximum length or width of the glass member 280, may be exposed through the top surface of the first mold 801. Thus, despite the presence of the protrusion from the side portion 283, the glass member 280 may easily be removed from the first mold 801, with the second mold 802 removed.

According to an embodiment, a glass member comprises a flat portion and a side portion extending from an edge of the flat portion, at least partially slanted or curved. The side portion includes a first curved portion extending from the flat portion and a second curved portion extending from the first curved portion and connected to the flat portion through the first curved portion, and at least one processing portion formed by at least a part of a border region between the first curved portion and the second curved portion. The at least one processing portion may have a different refractive index from at least another portion of the side portion.

At least a portion of an inner surface of the second curved portion may be formed to face an inner surface of the first curved portion or the flat portion in a direction perpendicular to one surface of the flat portion.

When viewed in a direction perpendicular to one surface of the flat portion, the side portion may be shaped as a closed loop surrounding the flat portion.

A plurality of processing portions may be arranged along a loop trace corresponding to the closed loop shape of the side portion.

The processing portion may be shaped as a closed loop.

When viewed in the direction perpendicular to the one surface of the flat portion, the flat portion may be polygonal or circular in shape.

At least a portion of the processing portion may protrude from the outer surface of the side portion.

The glass member may further comprise an ornamental layer formed on an inner surface of at least one of the flat portion, the first curved portion, or the second curved portion. The ornamental layer may include a base film and at least one of a UV curing layer, a deposition layer, or a printing layer formed on one surface of the base film.

The side portion may have a different thickness from the flat portion.

The processing portion may be formed at a contact point of a tangent line TL perpendicular to a flat surface including the flat portion among tangent lines to an outer surface of the side portion.

According to an embodiment, an electronic device comprises a glass member including a flat portion forming a front surface or a back surface of the electronic device and a side portion forming a side surface of the electronic device. The side portion is shaped as a closed loop surrounding the flat portion when viewed in a direction perpendicular to one surface of the flat portion. The side portion includes a first curved portion extending from the flat portion and a second curved portion extending from the first curved portion and connected to the flat portion through the first curved portion, and at least one processing portion formed by at least a part of a border region between the first curved portion and the second curved portion. The at least one processing portion has a different refractive index from at least another portion of the side portion.

At least a portion of an inner surface of the second curved portion may be formed to face an inner surface of the first curved portion or the flat portion in a direction perpendicular to one surface of the flat portion.

The electronic device may further comprise a sensor assembly disposed to face the side portion, inside the glass member. The sensor assembly may be configured to detect a user body's contact or a variation in pressure that occurs at the side portion.

At least a portion (hereinafter, referred to as an operable portion, may protrude from the outer surface of the side portion. The sensor assembly may be disposed corresponding to the operable portion.

The electronic device may further comprise at least one light emitting element disposed inside the glass member.

The glass member may further include an ornamental layer formed on at least a portion of an inner surface of the second curved portion. The ornamental layer may include a base film and at least one of a UV curing layer, a deposition layer, or a printing layer formed on one surface of the base film. The flat portion may form the front surface of the electronic device.

According to an embodiment, a glass member comprises a flat portion and a side portion extending from an edge of the flat portion, at least partially slanted or curved. The side portion is shaped as a closed loop surrounding the flat portion when viewed in a direction perpendicular to one surface of the flat portion. The side portion includes a first curved portion extending from the flat portion and a second curved portion extending from the first curved portion and connected to the flat portion through the first curved portion, and at least one processing portion formed by at least a part of a border region between the first curved portion and the second curved portion. At least a portion of an inner surface of the second curved portion is formed to face the flat portion or an inner surface of the first curved portion in the direction perpendicular to the one surface of the flat portion. The at least one processing portion has a different refractive index from at least another portion of the side portion.

A plurality of processing portions may be arranged along a loop trace corresponding to the closed loop shape of the side portion.

The processing portion may be shaped as a closed loop.

A portion of the processing portion may protrude from the outer surface of the side portion.

According to an embodiment, a molding device for manufacturing the glass member may include a first mold including a first molding space, a second mold including a second molding space) corresponding to the first molding space, the second mold coupled with the first mold to combine the first molding space and the second molding space into a glass molding space, a third mold configured to enter the inside of the glass molding space, a first pressure hole connected to an inner side wall of the glass molding space, and a second pressure hole formed in the third mold.

With the third mold positioned inside the glass molding space, an end of the second pressure hole may be positioned to face the inner side wall of the glass molding space.

The molding device may further comprise a suction pump connected to the first pressure hole. The second pressure hole may be configured to allow external gas to flow into the glass molding space.

The molding device may further comprise a booster pump connected to the second pressure hole. The first pressure hole may be configured to allow gas in the glass molding space to be discharged.

The first pressure hole may be formed through one of the first mold or the second mold. The second mold may be coupled with the first mold to form a third pressure hole. The first pressure hole may be connected with the glass molding space through the third pressure hole.

At least a portion of the inner side wall of the glass molding space may be concave.

With the second mold coupled with the first mold, the second mold may at least partially hide the inner side wall of the glass molding space when the first mold is viewed from outside of the second mold in a vertical direction.

As is apparent from the foregoing description, the glass member may form the back surface (or front surface) and a plurality of side surfaces of the electronic device, thereby providing an aesthetical appearance while meeting users' various tastes. The glass member may be combined with another glass member, giving the electronic device a better aesthetical appearance. The glass member may easily be manufactured by a combination of the curved surface of a forming space and a suction pump or pressing pump. The glass member may be formed in various shapes depending on the shape of the forming space. For example, embodiments of the disclosure allow the glass member to be easily formed into a designed shape and eliminating the need for post-processing treatment, such as polishing, thus saving costs.

While the disclosure has been shown and described with reference to embodiments thereof, it will be apparent to those of ordinary skill in the art that various changes in form and details may be made therein without departing from the spirit and scope of the disclosure as defined by the appended claims and their equivalents.

What is claimed is:

1. A glass member, comprising:
a flat portion; and
a side portion extending at least partially slanted or curved from an edge of the flat portion and including:
   a first curved portion extending from the flat portion;
   a second curved portion extending from the first curved portion and connected to the flat portion through the first curved portion; and
   at least one processing portion formed by removing at least a part of an outer surface of the side portion at a border region between the first curved portion and the second curved portion,
wherein the at least one processing portion has a first refractive index that is different from a second refractive index of the first curved portion and the second curved portion.

2. The glass member of claim 1,
wherein at least a portion of an inner surface of the second curved portion is formed to face an inner surface of the first curved portion or the flat portion in a direction perpendicular to one surface of the flat portion.

3. The glass member of claim 1,
wherein when viewed in a direction perpendicular to one surface of the flat portion, the side portion is shaped as a closed loop surrounding the flat portion.

4. The glass member of claim 3,
wherein a plurality of the processing portions are arranged along a loop trace corresponding to the closed loop shape of the side portion.

5. The glass member of claim 3,
wherein the processing portion is shaped as a closed loop.

6. The glass member of claim 3,
wherein when viewed in the direction perpendicular to the one surface of the flat portion, the flat portion is polygonal or circular in shape.

7. The glass member of claim 1,
wherein at least a portion of the processing portion protrudes from an outer surface of the side portion.

8. The glass member of claim 1, further comprising an ornamental layer formed on an inner surface of at least one of the flat portion, the first curved portion, or the second curved portion, wherein the ornamental layer includes:
a base film; and
at least one of an ultraviolet (UV) curing layer, a deposition layer, and a printing layer formed on one surface of the base film.

9. The glass member of claim 1,
wherein the side portion has a different thickness than a thickness of the flat portion.

10. The glass member of claim 1,
wherein the processing portion is formed at a contact point of a tangent line perpendicular to a flat surface including the flat portion among tangent lines to an outer surface of the side portion.

11. An electronic device, comprising:
a glass member including a flat portion forming a front surface or a back surface of the electronic device and a side portion forming a side surface of the electronic device,
wherein the side portion is shaped as a closed loop surrounding the flat portion when viewed in a direction perpendicular to one surface of the flat portion,
wherein the side portion includes a first curved portion extending from the flat portion, a second curved portion extending from the first curved portion and connected to the flat portion through the first curved portion, and at least one processing portion formed by removing at least a part of an outer surface of the side portion at a border region between the first curved portion and the second curved portion, and
wherein the at least one processing portion has a first refractive index that is different from a second refractive index of the first curved portion and the second curved portion.

12. The electronic device of claim 11,
wherein at least a portion of an inner surface of the second curved portion is formed to face an inner surface of the first curved portion or the flat portion in a direction perpendicular to one surface of the flat portion.

13. The electronic device of claim 11, further comprising a sensor assembly disposed to face the side portion inside the glass member,
wherein the sensor assembly is configured to detect contact with a user's body or a variation in pressure that occurs at the side portion.

14. The electronic device of claim 13, wherein at least an operable portion, formed by at least a part of the processing portion, protrudes from an outer surface of the side portion, and
wherein the sensor assembly is disposed corresponding to the operable portion.

15. The electronic device of claim 11, further comprising at least one light emitting element disposed inside the glass member.

16. The electronic device of claim 11,
wherein the glass member further includes an ornamental layer formed on at least a portion of an inner surface of the second curved portion,
wherein the ornamental layer includes a base film and at least one of an ultraviolet (UV) curing layer, a deposition layer, and a printing layer formed on one surface of the base film, and
wherein the flat portion forms the front surface of the electronic device.

17. A glass member, comprising:
a flat portion; and
a side portion extending from an edge of the flat portion, at least partially slanted or curved, where in the side portion is shaped as a closed loop surrounding the flat portion when viewed in a direction perpendicular to one surface of the flat portion, the side portion including:
   a first curved portion extending from the flat portion;
   a second curved portion extending from the first curved portion and connected to the flat portion through the first curved portion; and
   at least one processing portion formed by removing at least a part of an outer surface of the side portion at a border region between the first curved portion and the second curved portion,
wherein at least a portion of an inner surface of the second curved portion is formed to face the flat portion or an inner surface of the first curved portion in the direction perpendicular to the one surface of the flat portion, and
wherein the at least one processing portion has a first refractive index that is different from the first curved portion and the second curved portion.

18. The glass member of claim 17,
wherein a plurality of processing portions are arranged along a loop trace corresponding to the closed loop shape of the side portion.
19. The glass member of claim 17,
wherein the processing portion is shaped as a closed loop.
20. The glass member of claim 17,
wherein at least a portion of the processing portion protrudes from an outer surface of the side portion.

* * * * *